(12) United States Patent
Iwamoto et al.

(10) Patent No.: US 8,890,559 B2
(45) Date of Patent: Nov. 18, 2014

(54) CONNECTOR AND INTERFACE APPARATUS COMPRISING CONNECTOR

(75) Inventors: Yuichiro Iwamoto, Gunma (JP); Takayuki Nakamura, Saitama (JP)

(73) Assignee: Advantest Corporation, Tokyo (JP)

( * ) Notice: Subject to any disclaimer, the term of this patent is extended or adjusted under 35 U.S.C. 154(b) by 519 days.

(21) Appl. No.: 13/272,554

(22) Filed: Oct. 13, 2011

(65) Prior Publication Data
US 2012/0100756 A1    Apr. 26, 2012

(30) Foreign Application Priority Data

Oct. 21, 2010   (JP) ................................ 2010-236232

(51) Int. Cl.
*H01R 13/66* (2006.01)
*H04B 3/30* (2006.01)
*G01R 1/04* (2006.01)

(52) U.S. Cl.
CPC ................ *G01R 1/0416* (2013.01); *H04B 3/30* (2013.01); *H01R 13/6633* (2013.01)
USPC ........ 324/756.05; 333/5; 333/12; 439/620.22

(58) Field of Classification Search
CPC ..... G01R 1/0416; H01R 13/6633; H04B 3/30
USPC .................... 333/4, 5, 12, 181, 260; 439/192, 439/620.05, 620.21–620.22; 324/756.05
See application file for complete search history.

(56) References Cited

U.S. PATENT DOCUMENTS

| | | | |
|---|---|---|---|
| 6,448,863 B1 * | 9/2002 | Ogawa et al. | 333/12 |
| 7,548,549 B2 * | 6/2009 | Bergeron et al. | 370/419 |
| 2002/0036511 A1 * | 3/2002 | Kawai | 324/755 |
| 2005/0020134 A1 * | 1/2005 | Winings et al. | 439/608 |
| 2010/0267283 A1 * | 10/2010 | Pischl | 439/620.05 |

FOREIGN PATENT DOCUMENTS

| | | |
|---|---|---|
| JP | 2004-288455 | 10/2004 |
| JP | 2009-193680 | 8/2009 |

* cited by examiner

*Primary Examiner* — Benny Lee
*Assistant Examiner* — Rakesh Patel
(74) *Attorney, Agent, or Firm* — Greenblum & Bernstein, P.L.C.

(57) ABSTRACT

[Problems] In a connector to which unbalanced-type lines are connected, providing a connector which prevents crosstalk in the connector and an interface apparatus including the connector.

[Solutions] Comprising terminals to be connected with connectors, a plurality of boards having a plurality of transmission lines, one ends of the transmission lines being connected with the terminals, a housing for fixing the plurality of boards, and common mode choke coils provided on the boards and connected with balanced-type lines.

4 Claims, 12 Drawing Sheets

CONNECTOR AND INTERFACE APPARATUS COMPRISING CONNECTOR

TECHNICAL FIELD

The present invention relates to a connector and an interface apparatus comprising the connector. It is to be noted that the contents described and/or illustrated in the documents relevant to Japanese Patent Application No. 2010-236232 filed on Oct. 21, 2010 will be incorporated herein by reference, as a part of the description and/or drawings of the present application.

BACKGROUND ART

A connector is known which comprises a plurality of terminals having press-fit parts to be inserted into through holes, a plurality of boards having land patterns connected with the plurality of terminals and contact parts to be connected with a counterpart connector, and a housing for fixing the plurality of boards, wherein the boards are formed thereon with lines for connecting the land patterns and the contact parts (Patent Document 1).

PRIOR ART DOCUMENT(S)

Patent Document(s)

[Patent Document 1] Japanese Patent Publication No. 2004-288455

SUMMARY OF THE INVENTION

Problems to be Solved by the Invention

However, the above connector involves a problem that the signal waveform is affected by crosstalk between grounds of lines due to the leakage of signal between the grounds, that is, common mode noise, when unbalanced-type lines such as coaxial cables are connected with the plurality of terminals.

Problems to be solved by the present invention include providing a connector which prevents such crosstalk in the connector and an interface apparatus including the connector.

Means for Solving the Problems

[1] Features of the connector according to the present invention exist in that the connector comprises: a terminal to be connected with a counterpart connector; a plurality of boards having a plurality of transmission lines, each one end of the transmission lines being connected with the terminal; a housing for fixing the plurality of boards; and a common mode choke coil provided on the boards and connected with the transmission lines.

[2] In the above invention, the transmission lines may be balanced-type lines, and other ends of the transmission lines may be connected with unbalanced-type lines.

[3] In the above invention, the balanced-type lines may be parallel two lines formed on the boards, and the common mode choke coil may have a first coil provided on one line of the parallel two lines and a second coil provided on other line of the parallel two lines.

[4] In the above invention, the transmission lines may be unbalanced-type lines, and the terminal may be connected with a balanced-type line included in the counterpart connector.

[5] In the above invention, the common mode choke coil may have a first coil provided on a signal line of the unbalanced-type line and a second coil provided on a ground of the unbalanced-type line.

[6] In the above invention, the transmission lines may be balanced-type lines, and the terminal may be connected with an unbalanced-type line included in the counterpart connector.

[7] In the above invention, the terminal may be formed with balanced-type lines; and the transmission lines may be unbalanced-type lines.

[8] In the above invention, the plurality of boards may be arranged in a thickness direction of the boards, and other ends of the plurality of transmission lines may be arranged on one sides of the boards.

[9] The interface apparatus according to the present invention is an interface apparatus for relaying an electronic component as an object to be measured and a test head, and features thereof exist in that the interface apparatus includes a connector to be fitted with a counterpart connector and causing an electric signal from the test head to flow in the electronic component and that the connector comprises: a terminal to be connected with the counterpart connector; a plurality of boards having a plurality of transmission lines, each one end of the transmission lines being connected with the terminal; a housing for fixing the plurality of boards; and a common mode choke coil provided on the boards and connected with the transmission lines.

Advantageous Effect of the Invention

According to the present invention, the common mode choke coil is connected with the transmission line provided on the board thereby to prevent crosstalk caused between grounds of the lines due to common mode noise.

EMBODIMENTS FOR CARRYING OUT THE INVENTION

<<First Embodiment>>

Figure 1:
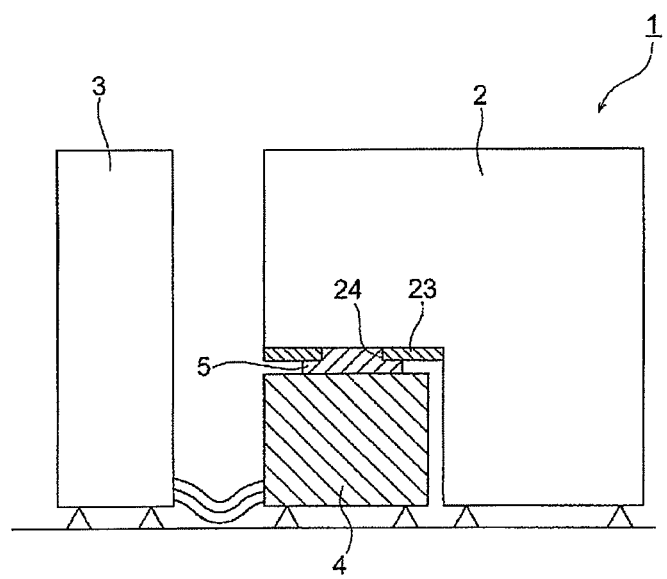
FIG. 1 is a schematic cross-sectional view illustrating an electronic component test apparatus according to the present embodiment.
Figure 2:
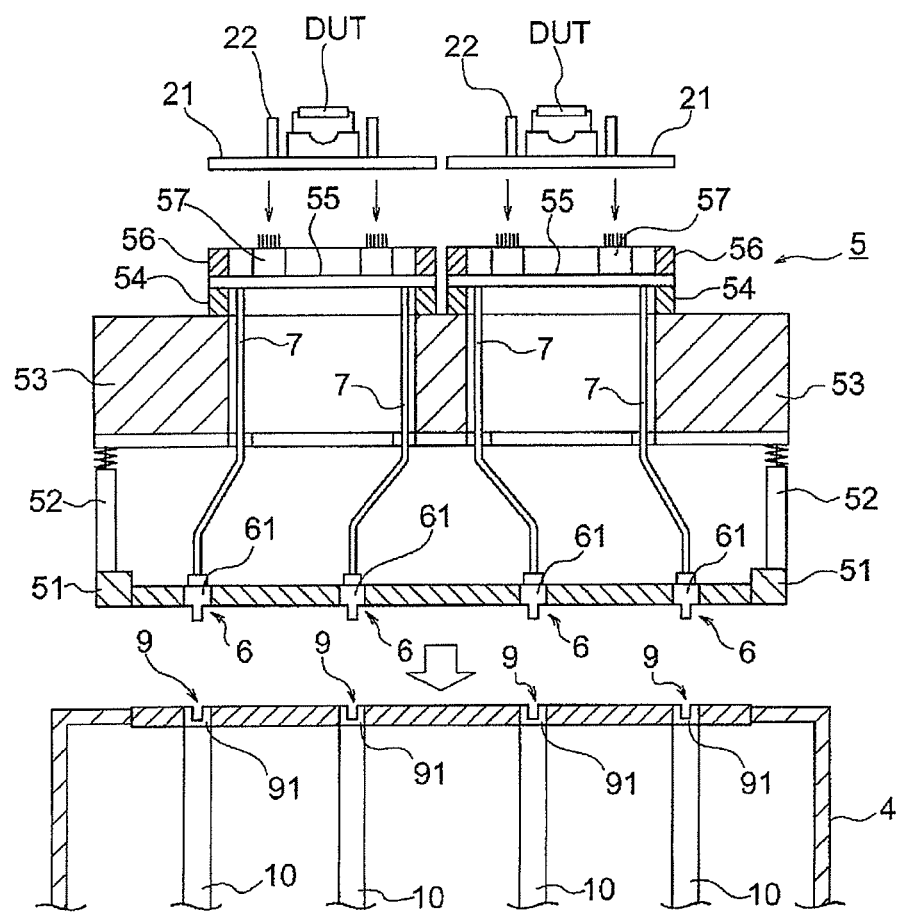
FIG. 2 is a cross-sectional view of a test head and a HIFIX shown in FIG. 1.

Hereinafter, embodiments of the present invention will be described with reference to the drawings. FIG. 1 is a schematic cross-sectional view illustrating an electronic component test apparatus according to the present embodiment, and FIG. 2 is a cross-sectional view of a test head and a HIFIX according to the present embodiment.

The electronic component test apparatus 1 according to the present embodiment is an electronic component test apparatus for testing electronic components, such as semiconductor integrated circuit elements, and comprises, as shown in FIG. 1, a handler 2 for handling devices under test (DUTs) as objects to be measured, a test head 4 to be electrically connected with DUTs during the test, and a tester main body (mainframe) 3 transmitting test signals to DUTs via the test head 4 thereby to perform the test of DUTs. This electronic component test apparatus 1 tests electrical characteristics of DUTs while applying thermal stress of high temperature or low temperature to DUTs, and then classifies DUTs in accordance with the test results.

As shown in FIG. 1, the upper portion of the test head 4 is attached with a HIFIX (High-Fidelity-Tester-Access-Fixture) 5 as an interface apparatus for relaying the electrical connection between DUTs and the test head 4 is attached to the upper portion of the test head 4.

An opening 24 is formed approximately at the center of a base part 23 of the handler 2, and the HIFIX 5 attached to the upper portion of the test head 4 is coupled into the opening 24.

As shown in FIG. 2, the HIFIX 5 is an SBC (Socket Board Change) type HIFIX 5 which is allowed to replace DUTs by exchanging socket boards 21 at uppermost positions. The HIFIX 5 has a plurality of connectors 6 at lowermost positions thereof. The connectors 6 are arranged so as to be parallel relative to the connecting face between the HIFIX 5 and the test head 4, and thus fixed to a frame 51.

Each connector 6 has a housing 61, and the upper face of each connector 6 is connected with the end portion of an electrical cable 7, which is obtained by bundling a plurality of coaxial cables.

The upper portion of the frame 51 is provided with a spacing frame 53 via space pillars 52 which are movable upwardly and downwardly in the vertical direction. Sub-socket boards 55 are provided on the upper portion of the spacing frame 53 via spacers 54. In addition, socket boards 21 are provided on the upper portions of the sub-socket boards 55 via spacers 56.

The socket boards 21 are provided with sockets 22, each of which has a plurality of contact pins (not shown) to contact DUTs.

The sub-socket boards 55 are formed with relay terminals 57, which are electrically connected with the electrical cables 7 via the sub-socket boards 55. Moreover, the socket boards 21 are disposed in the directions indicated by arrows in FIG. 2, thereby causing the sockets 22 to be electrically connected with the relay terminals 57 via the socket boards 21.

A plurality of connectors 9 are provided on the upper portion of the test head 4. The connectors 9 are counterpart connectors for the connectors 6 and thus fitted with the connectors 6. A plurality of pin cards 10 are inserted into the test head 4. The connectors 9 are provided on the edge portions of the pin cards 10 so as to be directed along the surface directions of the pin cards 10. The connectors 9 are electrically connected with the pin cards 10.

Through this structure, the detected signals associated with the transmitting and the receiving by the tester 3 are caused to flow in DUTs via the test head 4 and the HIFIX 5.

Figure 3:
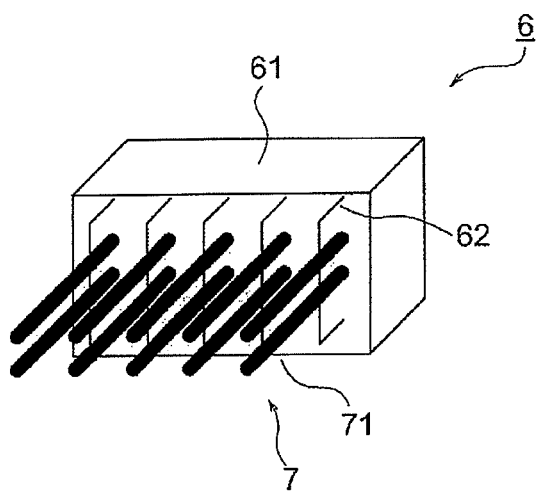
FIG. 3 is a schematic perspective view of the connector shown in FIG. 1.

The structure of the connectors 6 according to the present embodiment will then be described with reference to FIG. 3 and FIG. 4. FIG. 3 is a schematic perspective view of each connector 6, and FIG. 4 is a conceptual diagram illustrating the connection relationship among the connector 6, the connector 9, the electrical cable 7, and the pin card 10.

As shown in FIG. 3, each connector 6 has a structure in which a plurality of boards 62 are fixed to the housing 61, and the plurality of boards 62 are respectively arranged parallel to the thickness direction thereof, each with a rectangular plate-like shape. In addition, a plurality of coaxial cables 71 are connected with one side of the boards 62 at the opening side of the housing 61. Note that the bundle of the plurality of coaxial cables 71 represents the electrical cable 7.

The plurality of boards 62 are lined up parallel to the thickness direction of respective boards 62 thereby allowing the connection density of the coaxial cables 71 to be increased in one connector.

Figure 4:
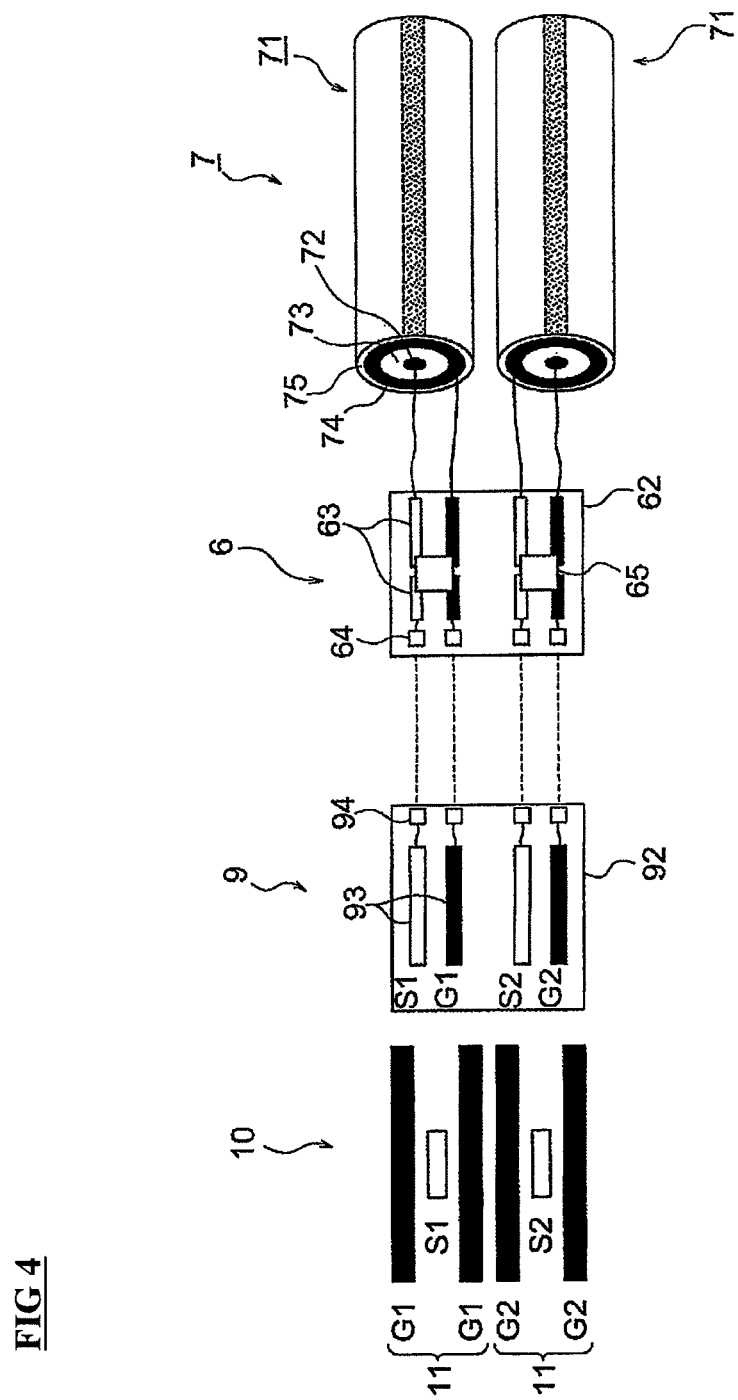
FIG. 4 is a conceptual diagram illustrating the connection relationship among the connectors, the electrical cable, and the pin card shown in FIG. 1.

As shown in FIG. 4, strip lines 11 as unbalanced-type lines are formed on each pin card 10, and individual grounds are independent from one another. Note that reference characters G1 and G2 in FIG. 4 denote grounds and S1 and S2 denote signal lines. Each connector 9 at the side of the test head 4 is provided with a plurality of boards 92 parallel to one another in a similar manner with the connector 6, and the boards 92 are fixed to a housing 91 (refer to FIG. 2). On the boards 92, a plurality of parallel two lines 93 as balanced-type transmission lines is formed. Lines S1 and S2 of each parallel two lines 93 are respectively connected with the signal lines S1 and S2 of the strip lines 11, while the lines G1 and G2 of the parallel two lines 93 are respectively connected with the grounds G1 and G2 of the strip lines 11. Respective lines of the parallel two lines 93 are connected with terminals 94.

Each coaxial cable 71 is formed in a cylindrical shape, which comprises a copper inner conductor 72 as an axis member, a dielectric 73 cladding the inner conductor 72, a copper outer conductor 74 cladding the dielectric 73, and insulator 75, such as polyethylene, covering the outer conductor 74.

On the boards 62 at the side of the HIFIX 5, a plurality of parallel two lines 63 as balanced-type transmission lines is formed. One ends of the parallel two lines 63 are connected with terminals 64 while the other ends of the parallel two lines 63 are connected with the coaxial cables 71. Lines G1 and G2 of the parallel two lines 63 are connected with the outer conductors 74 as grounds of the coaxial cables 71, while the lines S1 and S2 of the parallel two lines 63 are connected with the inner conductors 72 as signal lines of the coaxial cables 71.

By fitting the connectors 6 with the connectors 9, the terminals 64 are connected with the terminals 94 thereby causing the lines S1 and S2 of the parallel two lines 63 to be electrically connected with the lines S1 and S2 of the parallel two lines 93 and also causing the lines G1 and G2 of the parallel two lines 63 to be electrically connected with the lines G1 and G2 of the parallel two lines 93.

In addition, common mode choke coils 65 are mounted on the boards 62 of the connectors 6, and one coil of each common mode choke coil 65 is connected with the lines S1 or S2 of the parallel two lines 63 while the other coil of the common mode choke coil 65 is connected with the lines G1 or G2 of the parallel two lines 63. For example, chip-type coils are used as the common mode choke coils 65, which are mounted on the boards 62, and respective coils of each common mode choke coil 65 are connected with portions of respective lines of the parallel two lines 63.

Note that such chip-type coils are not necessarily to be used as the common mode choke coils 65, and portions of the lines may be formed as representing coils, for example. Moreover, the parallel two lines 63 or the common mode choke coils 65 may be mounted on the boards 62 such that they are embedded into the boards 62. This allows the thickness to be reduced with respect to the boards 62 including the parallel two lines 63 and the common mode choke coils 65, and a more number of the boards 62 may thus be provided in one connector 6 thereby to allow for higher density mounting.

Meanwhile, the electronic component test apparatus 1 according to the present embodiment supplies high-frequency signals from the tester main body 3 to DUTs attached to the upper portion of the test head 4 in relay with the HIFIX 5. It is preferred that the electronic component test apparatus 1 provides considerable number of such high-frequency signals to DUTs in a high density manner thereby to improve the detection efficiency. To this end, connectors of high density and high speed are required for the connectors 6 and connectors 9 which represent the connection area between the test head 4 and the HIFIX 5. At the same time, crosstalk (noise) has come to be an issue, which is caused between the connectors 6 and 9 and the coaxial cables 71 and the strip lines 11 connected with corresponding connectors 6 and 9.

Conventionally, in order to make crosstalk −40 dB or less caused in a high speed connector, connectors have been used which employ coaxial structures as lines in the connectors. However, such conventional connector structures are not suitable for high density connectors because employing coaxial structures causes the volume per one channel to remain large thereby not to allow for increasing the pin density. Moreover, employing coaxial structures also involves the problem of increasing the cost.

Furthermore, when the connectors 6 and connectors 9 are provided as terminal structures of balanced-type lines to be connected with the coaxial cables 71 and the strip lines 11 as unbalanced-type lines likewise the present embodiment, another problem is that, since unbalanced-type lines and balanced-type lines are directly connected with one another, signals may leak from each connector to ground lines due to common mode noise to cause crosstalk to occur thereby affecting the signal waveform.

In addition, although a method may be considered that ferrite-beads are attached to the coaxial cables 71 to suppress the noise, the density of the coaxial cables 71 is difficult to be increased by such a conventional method when the electrical cable 7 is tried to be formed of densely arranged coaxial cables 71 likewise the electronic component test apparatus 1 according to the present embodiment.

Figure 5:
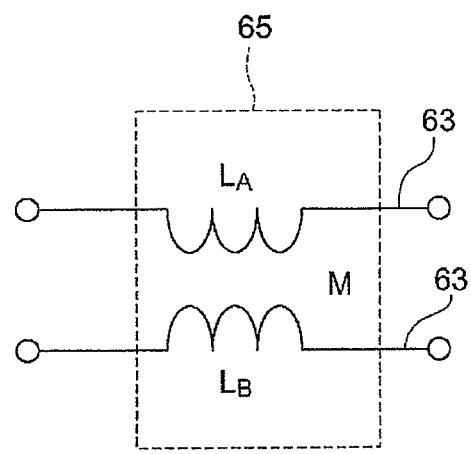
FIG. 5 is a diagram illustrating an equivalent circuit for a common mode choke coil and parallel two lines.

In order to obtain a connector structure of high density and high speed which prevents the crosstalk from occurring, the present embodiment provides the plurality of boards 62 in the connector 6 and connects the common mode choke coils 65 to the parallel two lines 63 of the boards 62. Hereinafter, the action of the common mode choke coils 65 will be described with reference to FIG. 5. FIG. 5 illustrates an equivalent circuit for the parallel two lines 63 and each common mode choke coil 65. $L_A$ denotes the inductance of a coil connected for one line of the parallel two lines 63, $L_B$ denotes the inductance of a coil connected for the other line of the parallel two lines 63, and M denotes the mutual inductance of these coils.

When high frequency signals flow in the parallel two lines 63, the signal flowing in one line and the signal flowing in the other line are of opposite directions with each other. In this case, the synthetic inductance L of the common mode choke coil 65 is calculated by the equation $L=L_A+L_B-2M$. In addition, the synthetic inductance L comes to be zero when a certain condition is set with respect to the frequencies of the high frequency signals to satisfy the equations $L_A=L_B=M$ for each coil inductance.

On the other hand, when crosstalk occurs due to common mode noise and the signals flow along the same direction in both lines of the parallel two lines 63, the synthetic inductance L of the common mode choke coil 65 is calculated by the impedance obtained through coupling $L_A+M$ and $L_B+M$ in parallel. In addition, the synthetic inductance L comes to be $L_A$ when a certain condition is set with respect to the frequencies of the high frequency signals to satisfy the equations $L_A=L_B=M$ for each coil inductance.

That is, when the detected signals flow normally in the parallel two lines 63, the inductance L of the common mode choke coil 65 is reduced for the detected signals thereby scarcely affecting the signal waveform. In contrast, when crosstalk occurs, the inductance L of the common mode choke coil 65 is increased for the noise, so that the noise components are attenuated. This allows the connectors 6 according to the present embodiment to suppress the noises while achieving less pronounced effect on the waveform.

Moreover, each connector 6 according to the present embodiment is configured such that the plurality of boards 62 are stacked in the thickness direction thereof and the coaxial cables 71 and the terminals of the parallel two lines 63 of the boards 62 are collectively arranged at the one sides of the boards 62. This configuration allows the connectors 6 to be achieved as connectors of high density and high speed.

Note that, although the present embodiment mounts the common mode choke coils 65 onto the connectors 6, they may be mounted on the connectors 9. The parallel two lines 93 as balanced-type lines are formed on the boards 92 of the connectors 9, and the strip lines 11 as unbalanced-type lines are connected with the parallel two lines 93. Consequently, crosstalk would possibly occur due to the connection between the balanced-type lines and the unbalanced-type lines, while on the other hand, the present embodiment may suppress noises by connecting the common mode choke coils 65 with the parallel two lines 93 of the connectors 9. Moreover, the present embodiment may also provide the common mode choke coils 65 on both the connectors 6 and the connectors 9.

Furthermore, although the present embodiment employs the parallel two lines 63 and 93 as balanced-type lines, other balanced-type lines may also be employed, and similarly to this, other unbalanced-type lines may be substituted for the coaxial cables 71 and the strip lines 11 as unbalanced-type lines.

<<Second Embodiment>>

Figure 6:
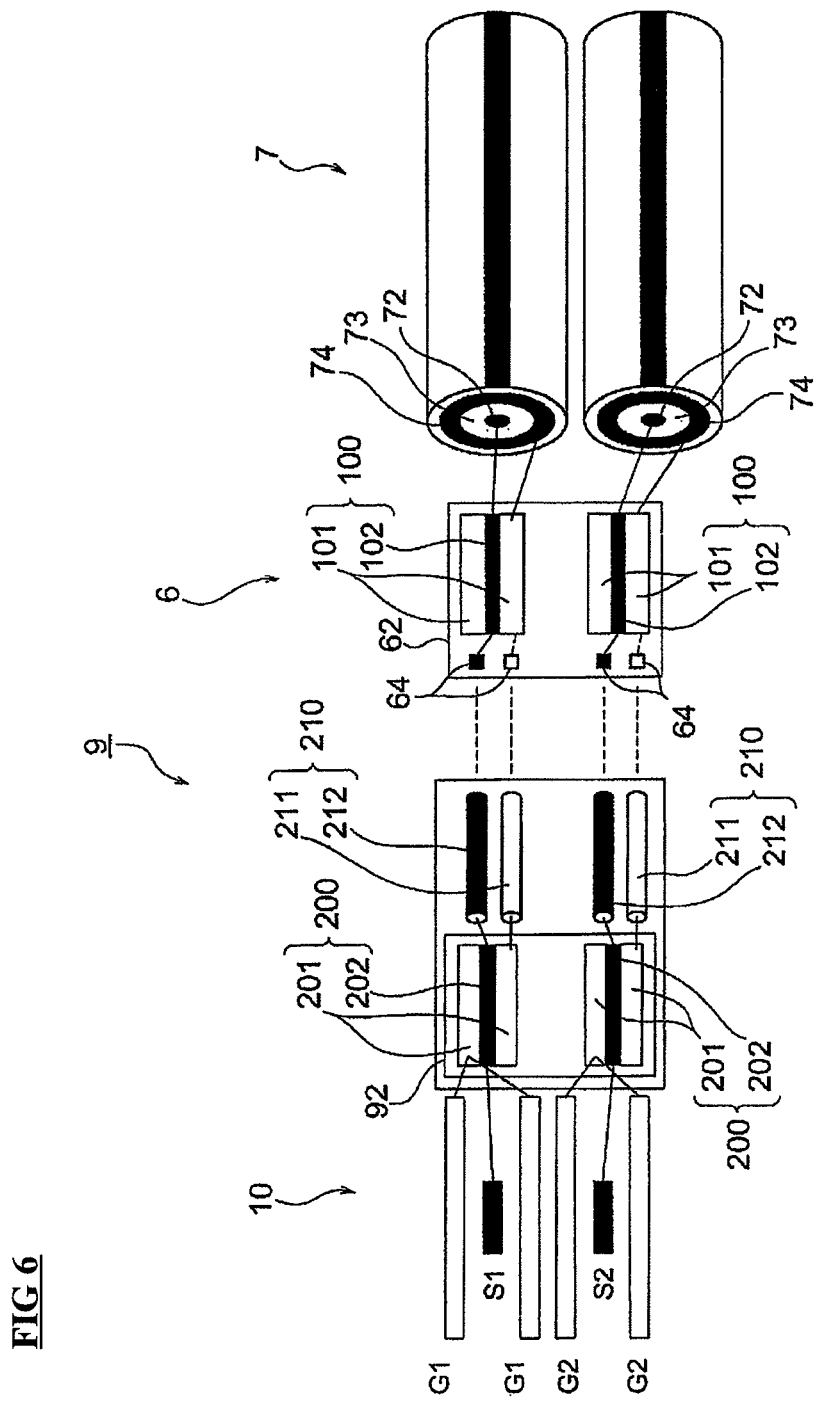
FIG. 6 is a conceptual diagram illustrating the connection relationship among the connectors, the electrical cable, and the pin card according to another embodiment.
Figure 7:
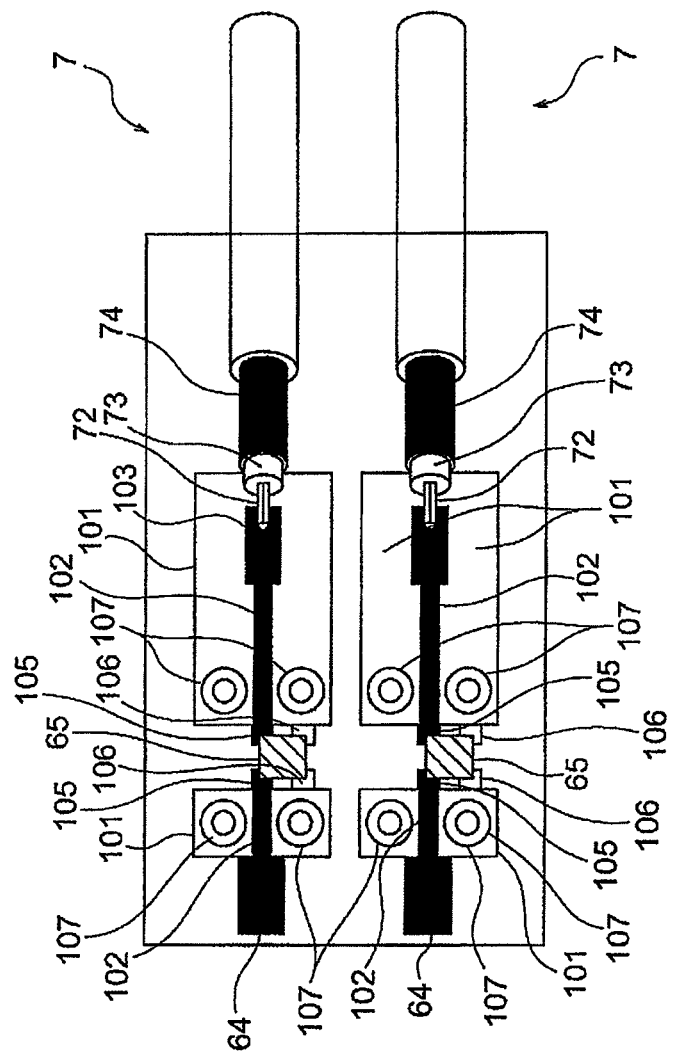
FIG. 7 is a schematic plan view illustrating the connection structure between the upper surface of each board and the electrical cable shown in FIG. 6.

FIG. 6 is a conceptual diagram illustrating the connection relationship among the connector 6, the connector 9, the electrical cable 7, and the pin card 10 according to another embodiment of the present invention. Compared to the above first embodiment, the present embodiment is different in the shapes of transmission lines formed on the boards 62 of the connectors 6 and the boards 92 of the connectors 9 and the connection structure of the common mode choke coils 65. The description for the structure other than this and same as that of the above first embodiment is arbitrarily applied to the present embodiment. The connectors 6 according to the present embodiment will now be described with reference to FIG. 6 to FIG. 8. FIG. 7 is a schematic plan view illustrating the connection structure between the upper surface of each board 62 and the electrical cable 7, and FIG. 8 is a schematic bottom plan view illustrating the connection structure between the lower surface of the board 62 and the electrical cable 7.

As shown in FIG. 6, unbalanced-type lines 100 are formed as unbalanced-type transmission lines on the board 62 of the connector 6. Coplanar-type transmission lines comprising a signal line 102 interposed between front surface grounds 101 are formed on the upper surface of the board 62. Spaces are provided between the front surface grounds 101 and each signal line 102. In addition, rear surface grounds 104 covering the signal lines 102 is formed on the lower surface of the board 62 (refer to FIG. 8). With respect to the thickness direction of the board 62, the rear surface grounds 104 are formed on areas corresponding to those of the front surface grounds 101 and the signal lines 102. Moreover, common mode choke coils 65 are connected with the signal lines 102 and the front surface grounds 101, while the detailed connection structure will be described later.

Figure 8:
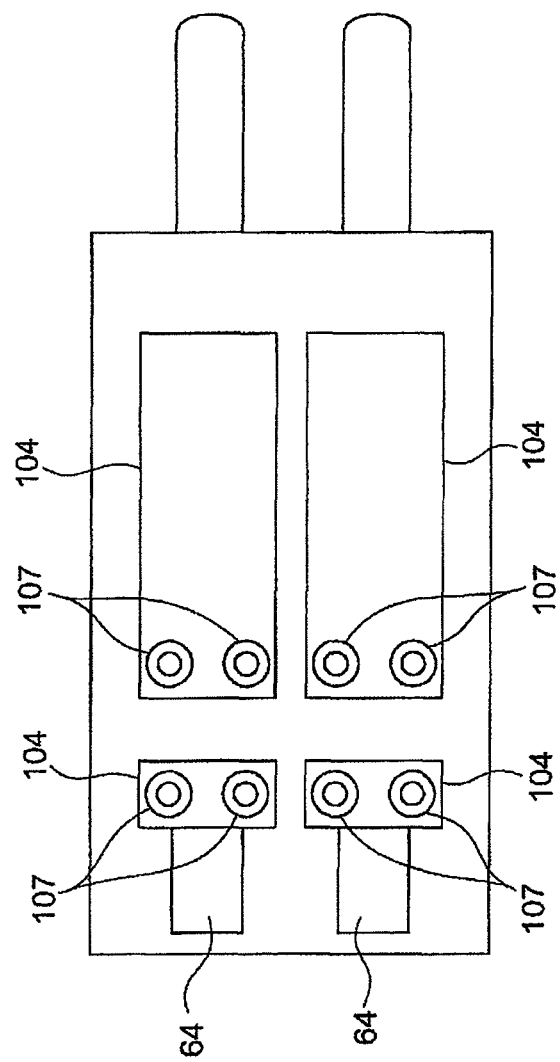
FIG. 8 is a schematic bottom plan view illustrating the connection structure between the lower surface of the board and the electrical cable shown in FIG. 6.

Terminals 64 for signal lines are connected with the signal lines 102, and terminals 64 for ground are connected with the rear surface grounds 104 (refer to FIG. 8). The inner conductors 72 of the coaxial cables 7 are connected with the signal lines 102, and the outer conductors 74 are connected with the front surface grounds 101. This allows the terminals 64, the unbalanced-type lines 100 and the coaxial cables 7 to be electrically connected.

The structure of the upper surface of the board 62 will then be described, which is shown in FIG. 7. In order to connect the common mode choke coils 65, the signal lines 102 and the front surface grounds 101 are formed such that portions of the lines are separated to form separating areas, and lead areas 105 extended from the signal lines 102 and lead areas 106 extended from the front surface grounds 101 are provided in the separating areas. Each common mode choke coil 65 is provided with respect to the lead areas 105 and the lead areas 106, so that one coil of the common mode choke coil 65 is electrically connected with respective separated lead areas 105 while the other coil of the common mode choke coil 65 is electrically connected with respective separated lead areas 106.

In addition, lead areas 103 are provided at one ends of the signal lines 102 at the side of the coaxial cables 7, and the lead areas 103 are connected with the inner conductors 72. The surface grounds 101 are connected with the outer conductors 74. Note that, although not shown in FIG. 7, lead areas may be provided at the front surface grounds 101 to connect the outer conductors 74 and the surface grounds 101.

Penetrating vias 107 are provided for the front surface grounds 101. The front surface grounds 101 and the rear surface grounds 104 are conductively coupled with one another via the penetrating vias 107.

As shown in FIG. 8, the rear surface grounds 104 and the penetrating vias 107 are provided on/for the rear surface of the board 62. The rear surface grounds 104 are formed such that portions of the lines are separated so as to correspond to the signal lines 102 and the front surface grounds 101. In addition, one ends of the rear surface grounds 104 at the side of the connectors 9 are extended to form the terminals 64.

Note that the number of the penetrating vias 107 for one set is not necessarily to be four and any number of the penetrating vias 107 may be employed so long as the front surface grounds 101 and the rear surface grounds 104 are conductively coupled. Moreover, although the unbalanced-type lines 100 according to the present embodiment are provided with the lead areas 103, the lead areas 105 and the lead areas 106 in order to connect with the coaxial cables 7 and the common mode choke coils 65, the coaxial cables 7 and the common mode choke coils 65 may be connected with the unbalanced-type lines 200. Furthermore, the lead areas 106 may be extended from the rear surface grounds 204.

Referring again to FIG. 6, the connectors 9 will be described. Unbalanced-type lines 200 as unbalanced-type transmission lines are formed on the board 92 of the connectors 9. Coplanar-type transmission lines comprising a signal line 202 interposed between front surface grounds 201 are formed on the upper surface of the board 92. Spaces are provided between the front surface grounds 201 and each signal line 202. In addition, rear surface grounds 204 covering the signal lines 202 from the lower surface is formed on the lower surface of the board 92 (refer to FIG. 10). With respect to the thickness direction of the board 92, the rear surface grounds 204 are formed on areas corresponding to those of the front surface grounds 201 and the signal lines 202.

Each connector 9 is provided with cable-like terminals 210, which are two-line type lines and balanced-type lines and which have cable-like terminals 212 for signal lines and cable-like terminals 211 for ground lines. One ends of the terminals 212 are connected with the signal lines 202, and one ends of the terminals 211 are connected with the front surface grounds 201. When the connector 9 is fitted with the connector 6, then the other ends of the terminals 212 are electrically connected with the terminals 64 for signal lines, and the other ends of the terminals 211 are electrically connected with the terminals 64 for ground lines.

Figure 9:
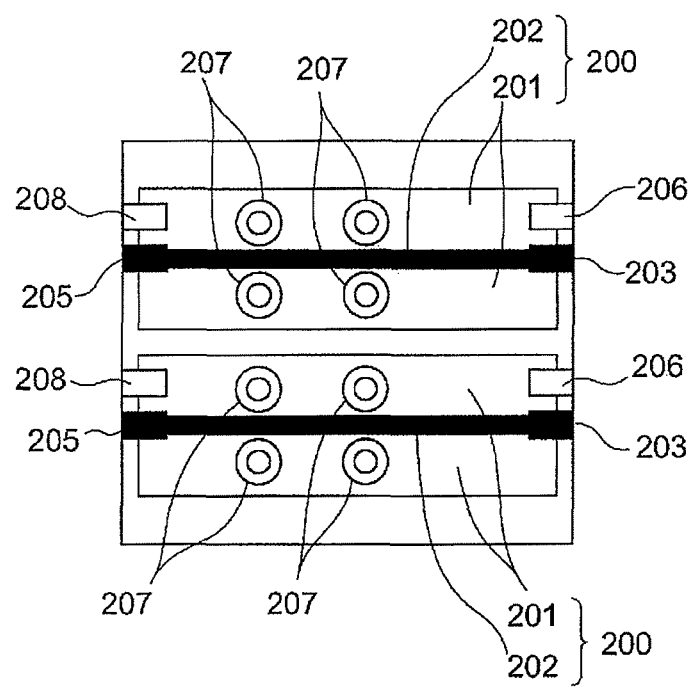
FIG. 9 is a schematic plan view illustrating the connection structure between the upper surface of each board and the electrical cable shown in FIG. 6.

The structure of the upper surface of the board 92 will now be described with reference to FIG. 9. FIG. 9 depicts a schematic plan view of the upper surface of the board 92. Regarding both ends of the signal lines 202, lead areas 203 and lead areas 205 are provided to extend from the signal lines 202, while lead areas 206 and leads area 208 are provided to extend from the front surface grounds 201. The lead areas 203 and the lead areas 206 are connected with the terminals 212 and 211, respectively, and the lead areas 205 and the lead areas 208 are connected with the signal lines and grounds of the strip lines 11, respectively. In addition, four penetrating vias 207 are provided for one set of the front surface grounds 201. The front surface grounds 201 and the rear surface grounds 204 are conductively coupled via the penetrating vias 207.

Figure 10:
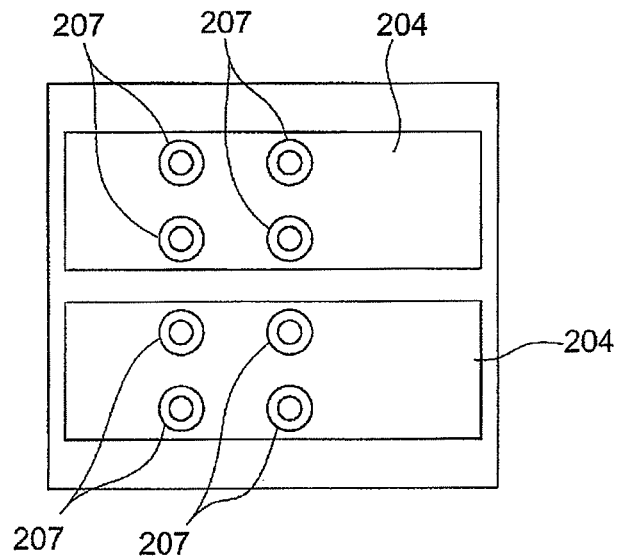
FIG. 10 is a schematic bottom plan view illustrating the connection structure between the lower surface of the board and the electrical cable shown in FIG. 6.

The structure of the lower surface of the board 92 will now be described with reference to FIG. 10. FIG. 10 depicts a schematic plan view of the lower surface of the board 92. As shown in FIG. 10, the rear surface grounds 204 and the penetrating vias 207 are provided on/for the rear surface of the board 92. The shape of the rear surface grounds 204 is planar shape and is corresponding to the signal lines 202 and the front surface grounds 201.

Note that the number of the penetrating vias 207 for one set is not necessarily to be four and any number of the penetrating vias 207 may be employed so long as the front surface grounds 201 and the rear surface grounds 204 are conductively coupled. Moreover, although the unbalanced-type lines 200 according to the present embodiment are provided with the lead areas 203, the lead areas 205, the lead areas 206 and the lead areas 208 in order to connect with the strip lines 11 and the terminals 210, the strip lines 11 and the terminals 210 may be directly connected with the unbalanced-type lines 200. Furthermore, the lead areas 206 and the lead areas 208 may be extended from the rear surface grounds 204.

Incidentally, if the connectors 6 and the connectors 9 are fitted with one another, then the unbalanced-type lines 100 are connected with the terminals 210 as balanced-type lines included in the connectors 9. When unbalanced-type lines and balanced-type lines are directly connected, signals are generated at outside of grounds thereby causing crosstalk to occur. On the contrary, the present embodiment provides, as shown in FIG. 7, the common mode choke coils 65 on the unbalanced-type lines 100. This allows the common mode choke coils 65 to attenuate noise components even if crosstalk occurs between the connectors 6 and the connectors 9, thereby reducing the effect on the waveform of the signals transmitting through the unbalanced-type lines 100 and the terminals 210. Consequently, the present embodiment may prevent crosstalk from occurring between grounds of the lines.

Note that, in the connectors 9 according to the present embodiment, the unbalanced-type lines 200 are connected with the terminals 210 as balanced-type lines thereby possibly causing crosstalk to occur, and common mode choke coils 65 may thus be provided on the unbalanced-type lines 200. This allows the present embodiment to prevent crosstalk from occurring between grounds of the lines in the connectors 9.

When alternatively to the coaxial cables 7 or the strip lines 11, balanced-type lines are connected with the connectors 6 or the connectors 9, crosstalk may possibly occur because the unbalanced-type lines 100 or the unbalanced-type lines 200 are connected with those balanced-type lines. Accordingly, the common mode choke coils 65 may be provided on the unbalanced-type lines 100 and/or the unbalanced-type lines 200 in the present embodiment.

Furthermore, in the present embodiment, the parallel two lines 63 of the first embodiment may be employed as the unbalanced-type lines 100 of the boards 62, and the parallel two lines 93 of the first embodiment may be employed as the unbalanced-type lines 200 of the boards 92.

<<Third Embodiment>>

Figure 11:
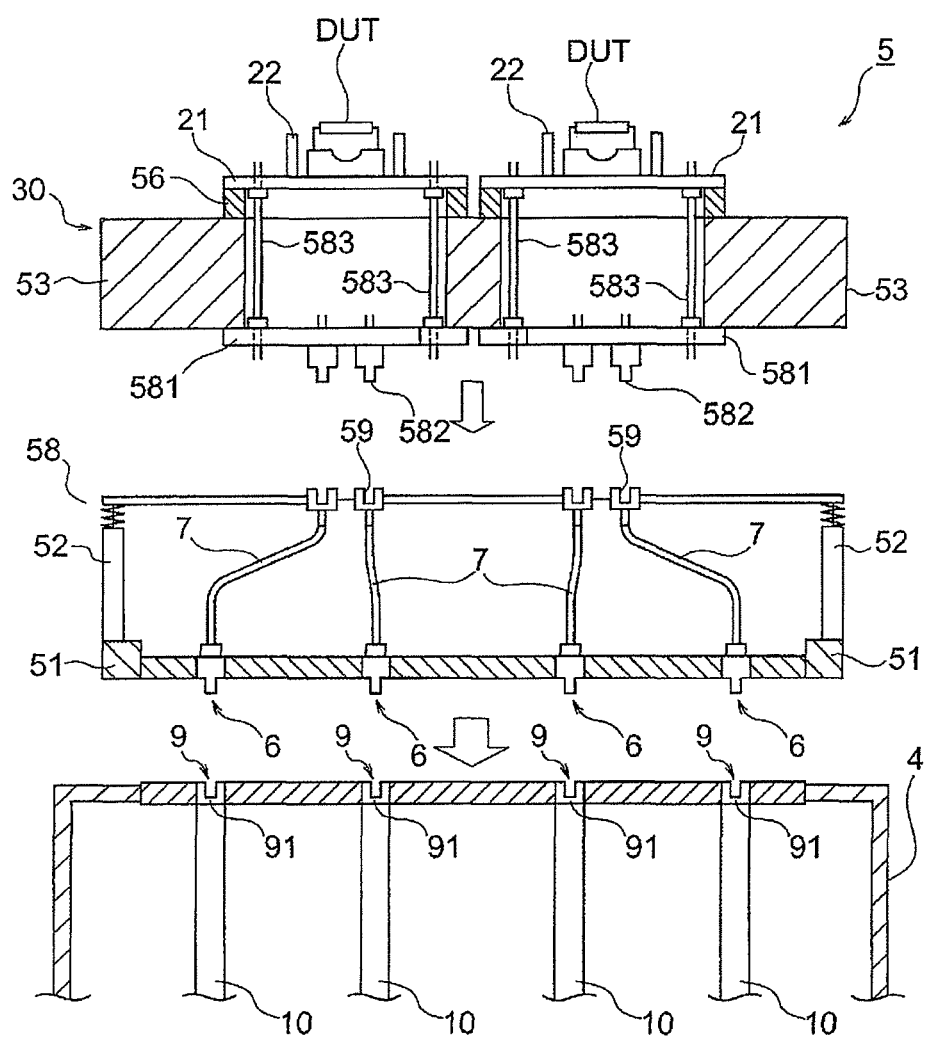
FIG. 11 is a cross-sectional view of the test head and the HIFIX according to another embodiment.

FIG. 11 is a cross-sectional view of the test head 4 and the HIFIX 5 according to another embodiment of the present invention. Compared to the above first and second embodiments, the present embodiment is different in the structure of a part of the HIFIX 5. The description for the structure other than this and same as those of the above first and second embodiments is applied to the present embodiment.

The HIFIX 5 according to the present embodiment is, as shown in FIG. 11, a HIFIX 5 of CLS (Cable Less) type which is capable of dealing with product variety change of IC devices under test by replacing an uppermost DSA (Device Specific Adapter) 30.

The HIFIX 5 is configured such that components from the sockets 22 to a board 581 are integrated as the DSA 30, which is detachably attached to a board 58 by means of connectors 582 and connectors 59. The DSA 30 is provided with a spacing frame 53 on the upper portions of the boards 581, and the socket boards 21 are provided on the upper portion of the spacing frame 53 via spacers 56. The sockets 22 are mounted on the socket boards 21.

The boards 581 and the socket boards 21 are connected by cables 583 therebetween. The connectors 582 are provided at plural positions of the boards 581, and the connectors 59 are also provided at plural positions of the board 58 so as to fit with those connectors 582. The connectors 582 are electrically connected with the cables 583, and the connectors 59 are connected with the electrical cables 7.

When the connectors 582 are fitted with the connectors 59 and the connectors 6 are fitted with the connectors 9, electrical connection is established from the tester main body 3 via the test head 4 and the HIFIX 5 to DUTs, thereby to supply high frequency signals to DUTs.

As similar to the first embodiment, the common mode choke coils 65 are mounted on the boards 62 of the connectors 6. In addition, the present embodiment may employ the similar structure for the connectors 582 and the connectors 59 and similar connection structure for the common mode choke coils 65, and the common mode choke coils 65 may thus be mounted on the connectors 582 or the connectors 59. According to the present embodiment, noise due to crosstalk is suppressed in the connectors 582, the connectors 59 and the HIFIX 5 including the connectors 582 and the connectors 59.

<<Fourth Embodiment>>

Figure 12:
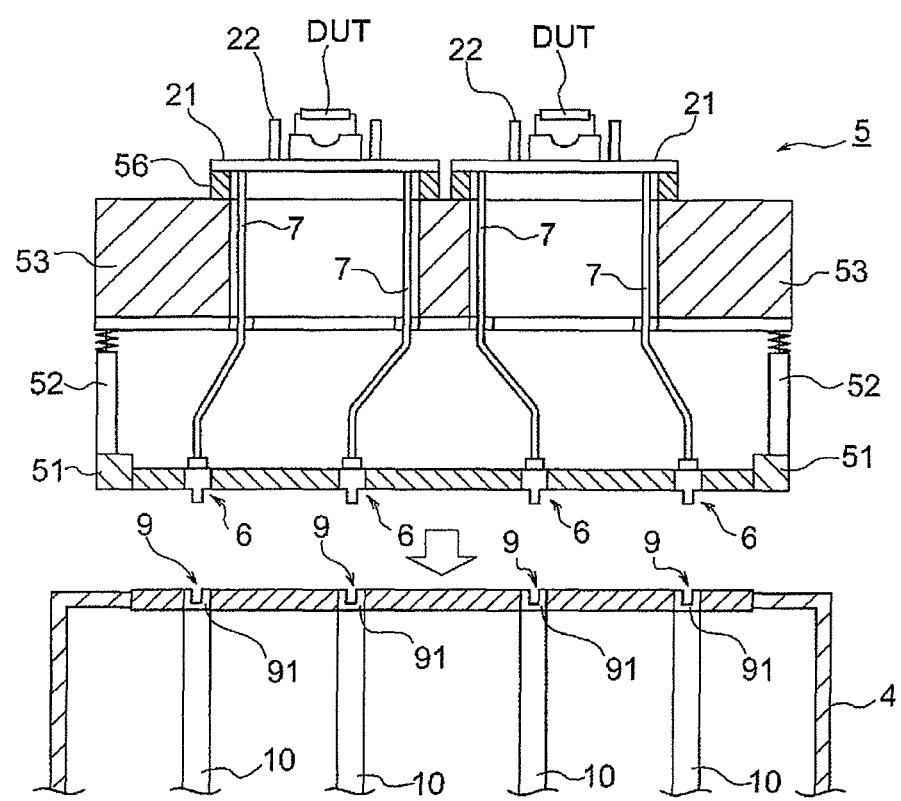
FIG. 12 is a cross-sectional view of the test head and the HIFIX according to another embodiment.

FIG. 12 is a cross-sectional view of the test head 4 and the HIFIX 5 according to another embodiment of the present invention. Compared to the above first and second embodiments, the present embodiment is different in the structure of a part of the HIFIX 5. The description for the structure other than this and same as those of the above first and second embodiments is applied to the present embodiment.

The HIFIX 5 according to the present embodiment is, as shown in FIG. 12, a HIFIX 5 of CCN (Cable Connection) type is entirely replaced for every product variety change of IC devices under test. This HIFIX 5 is different from the HIFIX 5 according to the first embodiment or the third embodiment in the point that the HIFIX 5 has no separable portion.

The connectors 6 are arranged at the lowermost portion of the HIFIX 5 so as to be parallel relative to the connection face between the HIFIX 5 and the test head 4.

Ends of the electrical cables 7 are directly connected with the socket boards 21 by soldering. The sockets 22 are mounted on the socket boards 21. The present embodiment ensures high quality testing performances because the connectors 6 and the socket boards 21 are directly connected.

When the connectors 6 are fitted with the connectors 9, electrical connection is established from the tester main body 3 via the test head 4 and the HIFIX 5 to DUTs, thereby to supply high frequency signals to DUTs.

As similar to the first embodiment, the common mode choke coils 65 are mounted on the boards 62 of the connectors 6. According to the present embodiment, noise due to crosstalk is suppressed in the connectors 6 and the HIFIX 5 including those connectors. Note that the common mode choke coils 65 may be mounted on the connectors 9.

[Description Of Reference Numerals]

1 . . . electronic component test apparatus
2 . . . handler
3 . . . tester main body
4 . . . test head
5 . . . HIFIX
  51 . . . frame
  52 . . . space pillar
  53 . . . spacing frame
  54 . . . spacer
  55 . . . sub-socket board
  56 . . . spacer
  57 . . . relay terminal
  58 . . . board
  581 . . . board
  582 . . . connector
  583 . . . cable
  59 . . . connector
6 . . . connector
  61 . . . housing
  62 . . . board
  63 . . . parallel two lines
  64 . . . terminal
  65 . . . common mode choke coil
7 . . . electrical cable
  71 . . . coaxial cable
  72 . . . inner conductor
  73 . . . dielectric
  74 . . . outer conductor 75 ... insulator
9 ... connector
  91 ... housing
  92 ... board
  93 ... parallel two lines
  94 ... terminal
10 ... pin card
  11 ... strip line
21 ... socket board
22 ... socket
23 ... base part
24 ... opening
30 ... DSA
100 ... unbalanced-type lines
101 ... front surface ground
102 ... signal line
  103 ... lead area
  104 ... rear surface ground
  105 ... lead area
  106 ... lead area
  107 ... penetrating vias
200 ... unbalanced-type lines
201 ... front surface ground
202 ... signal line
  203 ... lead area
  204 ... rear surface ground
  205 ... lead area
  206 ... lead area
  207 ... penetrating via
  208 ... lead area
210 ... terminal
211 ... terminal
212 ... terminal

The invention claimed is:

1. A connector comprising:
a terminal to be connected with a counterpart connector;
a plurality of boards having a plurality of unbalanced-type transmission lines, a respective one end of the plurality of unbalanced type transmission lines being connected with the terminal;
a housing for fixing the plurality of boards; and
a common mode choke coil respectively provided on the plurality of boards and connected with the plurality of unbalanced type transmission lines, wherein the terminal is to be connected with a balanced-type line included in the counterpart connector.

2. The connector as set forth in claim 1, wherein the respective common mode choke coil has a corresponding first coil provided on a signal line of the plurality of unbalanced-type lines and a corresponding second coil provided on a ground of the plurality of unbalanced-type lines.

3. An interface apparatus for relaying an electronic component as an object to be measured and a test head, the interface apparatus including a connector to be fitted with a counterpart connector and causing an electric signal from the test head to flow in the electronic component, the connector comprising:
a terminal to be connected with the counterpart connector;
a plurality of boards having a plurality of unbalanced-type transmission lines, a respective one end of the plurality of unbalanced-type transmission lines being connected with the terminal;
a housing for fixing the plurality of boards; and
a common mode choke coil respectively provided on the plurality of boards and connected with the plurality of unbalanced-type transmission lines, wherein the terminal is to be connected with a balanced-type line included in the counterpart connector.

4. A connector comprising:
a terminal formed with balanced-type lines and configured to be connected with a counterpart connector;
a plurality of boards having a plurality of unbalanced-type transmission lines, a respective one end of the plurality of unbalanced-type transmission lines being connected with the terminal;
a housing for fixing the plurality of boards; and
a common mode choke coil respectively provided on the plurality of boards and connected with the plurality of unbalanced-type transmission lines.

* * * * *